310-334 SR

9/25/79 OR 4,169,236

United States Patent [19]

Epstein

[11] 4,169,236

[45] Sep. 25, 1979

[54] ROTATION OF CHARACTERISTIC VECTORS WITH PIEZOELECTRIC COUPLING

[75] Inventor: Seymour Epstein, Deal, N.J.

[73] Assignee: The United States of America as represented by the Secretary of the Army, Washington, D.C.

[21] Appl. No.: 866,118

[22] Filed: Dec. 30, 1977

[51] Int. Cl.[2] .......... H01L 41/10

[52] U.S. Cl. .......... 310/334; 333/193

[58] Field of Search .......... 310/334; 333/30 R, 72

[56] References Cited

U.S. PATENT DOCUMENTS

| | | | |
|---|---|---|---|
| 3,200,354 | 8/1965 | White | 310/334 X |
| 3,234,488 | 2/1966 | Fair | 310/334 X |
| 3,286,205 | 7/1966 | Ballato | 310/334 X |
| 3,304,520 | 2/1967 | Auld | 333/30 X |
| 3,321,647 | 5/1967 | Tien | 310/334 |
| 4,117,424 | 9/1978 | Coldren et al. | 333/30 R |

*Primary Examiner*—Mark O. Budd

*Attorney, Agent, or Firm*—Nathan Edelberg; Jeremiah G. Murray; Daniel D. Sharp

[57] ABSTRACT

Acoustic ultrasonic waves are launched in a block of single-crystal material, such as alpha-quartz, by means of a transducer fastened to one end of the block. The waves are steered by electrically altering the properties of the crystal between the piezoelectrically unstiffened and stiffened excitation modes.

6 Claims, 7 Drawing Figures

FIG. 1
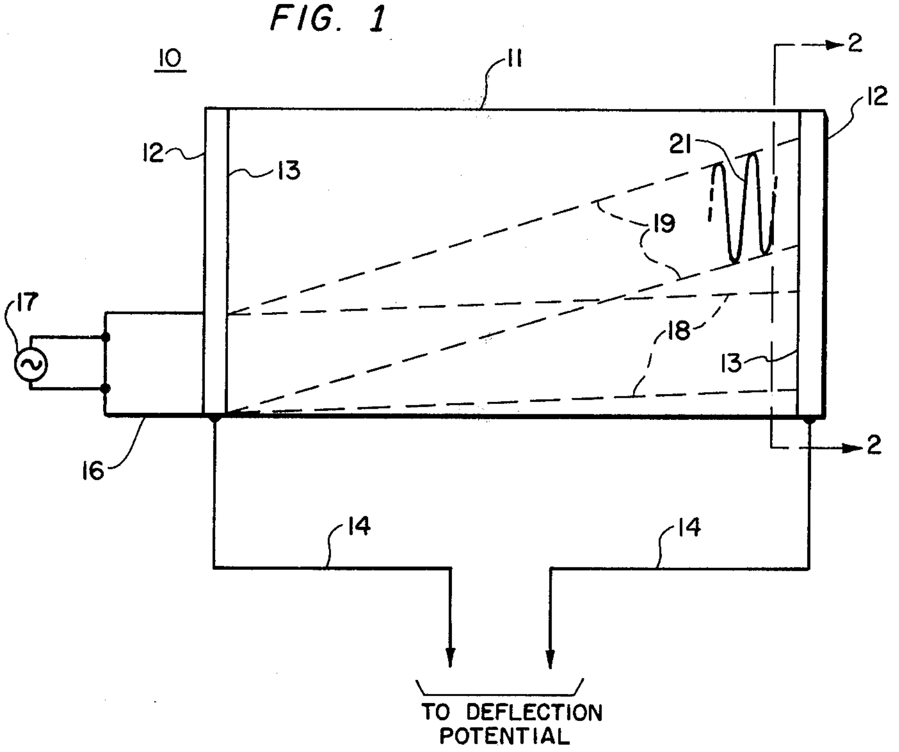
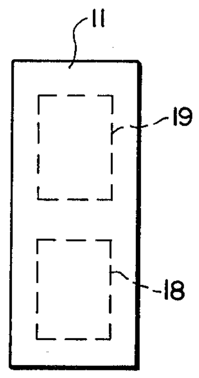
FIG. 2
FIG. 5
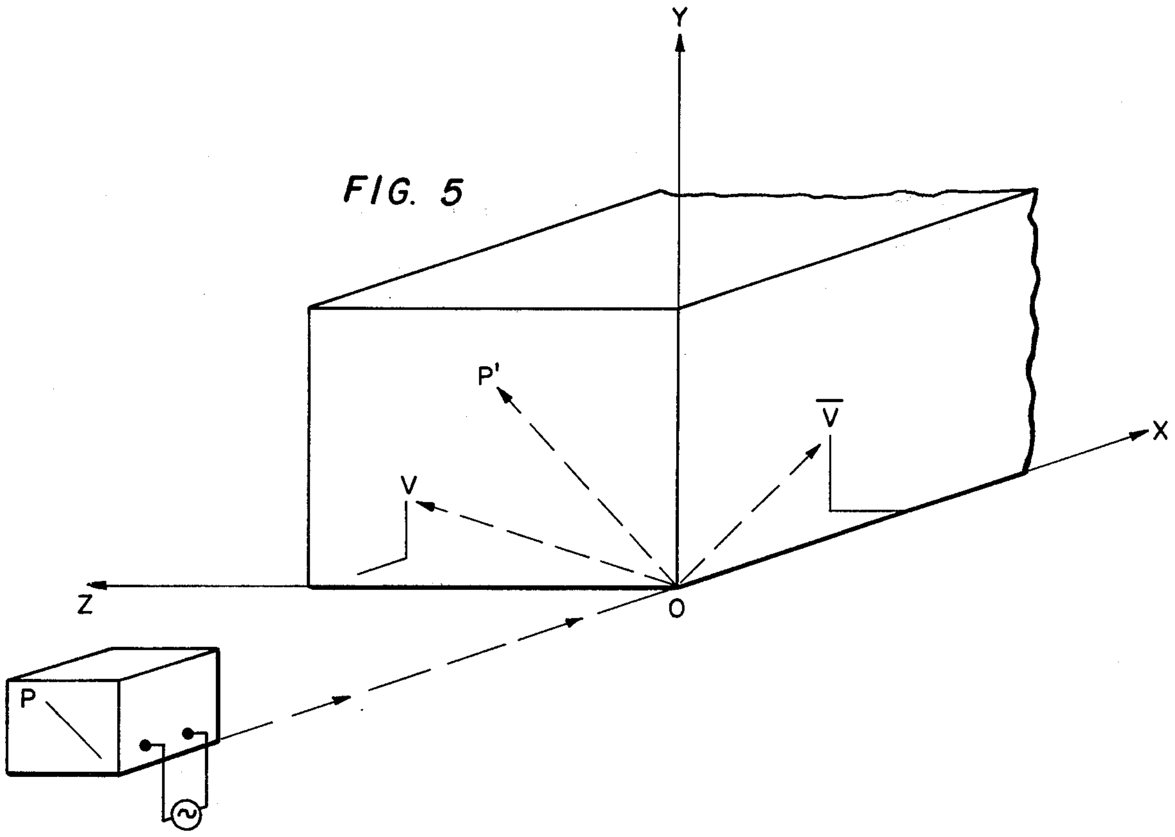

ROTATION OF CHARACTERISTIC VECTORS WITH PIEZOELECTRIC COUPLING

GOVERNMENT LICENSE

The invention described herein may be manufactured and used by or for the Government for governmental purposes without the payment of any royalties thereon or therefor.

BACKGROUND OF THE INVENTION (a) Field of the Invention

Broadly speaking, this invention relates to the selective deflection of ultrasonic acoustic beams. More particularly, in a preferred embodiment, this invention relates to the selective deflection of ultrasonic acoustic beams in piezoelectric solids by the use of externally addressable electronic signals.

(b) Discussion of the Prior Art

The steering of ultrasonic acoustic beams has application to a wide variety of devices such as acousto-optic deflectors, modulators and Q-switches; fiber optic and integrated circuit couplers; piezoelectric crystal filters, resonators, and delay lines, as well as to acoustic imaging, switching and multiplexing devices. Unfortunately, heretofore, existing devices for deflecting an acoustic beam have not been entirely satisfactory due to the size and cost of the equipment which is necessary to effect such changes. What is clearly needed is a device which is inexpensive and efficient, compatible with microcircuitry, all solid-state, rugged, and radiation resistant. Such a device has fortunately been achieved in the invention to be disclosed and claimed below, The distinction between elastic and electroelastic waves in quartz has been experimentally demonstrated. The apparent inequality of the measurement of the two elastic constants, $c_{14}$ and $c_{56}$, is explained by taking into account piezoelectric effects. The stiffened elastic coefficients, $c_{\alpha\beta}{}^{kD}$, have been shown to determine the propagation velocity of elastic-type waves in piezoelectric materials. (In the following discussion, Greek letter subscripts take on the values 1 to 6; Latin subscripts, 1 to 3). Subsequently, the $c_{\alpha\beta}{}^{kD}$ were shown to determine other elastic properties of unbounded piezoelectrics.

The relation between stiffened and unstiffened propagation velocities along a common wave normal in an unbounded piezoelectric has been considered analytically. For propagation directions, modes, and materials wherein the piezoelectric coupling is large and the stiffening contribution to the unstiffened velocity, $\underline{v}$, is also large, the three stiffened characteristic values, $\overline{\lambda}_i \equiv \rho \overline{v}_i^2$ ($\rho$ is the material density) are in general not closely and simply related to the three unstiffened ones, $\lambda_j \equiv \rho v_j^2$; however, when the piezoelectric contribution is $\lambda_j$ is small, then each stiffened mode corresponds to a specific unstiffened one, a correspondence which is usually taken for granted. Clearly, when such a correspondence exists, a direct comparison of any particular stiffened and unstiffened quantity is meaningful. In the following discussion, the orientation of the normal-mode or characteristic vectors $\vec{U}_i$ for stiffened or electroelastic waves relative to those $\vec{S}_j$ for unstiffened or elastic waves with parallel wave fronts will be considered. (The vectors and the sets of axes they define are hereinafter referred to as "stiffened" or "unstiffened".)

Inherent in this analysis is the mutual orthogonality of the three vectors of each set. On the assumption that the $\vec{U}_i$ and $\vec{S}_j$ have a common origin, the two sets are rotated with respect to each other. This is shown after obtaining expressions for the $\vec{U}_j$ in the coordinate frame of the $\vec{S}_j$. The form of these expressions shows that the matrix representing the rotation is compatible with an infinitesimal rotation about a unique direction. The magnitude and direction of rotation, which are functions of the direction of propagation, depend in detail upon the differences between pairs of unstiffened characteristic values and upon the components of the piezoelectric stiffening vector in the unstiffened coordinate frame, the latter ultimately depending upon the piezodielectric coefficients. When one of the modes is unstiffened, the rotation is about the unstiffened axis. The notation used is explained as introduced.

The propagation of a plane elastic wave in a semi-infinite piezodielectric is described by $$(\Gamma_{ij}{}^{kD} - \overline{\lambda}\delta_{ij})V_j{}^{kD}. \quad (1)$$

(Summation over repeated subscripts of factors is understood throughout except as indicated.) $\Gamma_{ij}{}^{kD} \equiv \Gamma_{ij} + \Xi_i \Xi_j / \xi^s$ where $\Gamma_{ij} \equiv c_{irjs}{}^E l_r l_s$ is the sum of products of the unstiffened elastic constants with direction cosines of the wave normal, $\Xi_i \equiv e_{ist} l_s l_t$ is the sum of products of the piezoelectric constants and direction cosines, and $\epsilon^s \equiv \epsilon^{vu} l_v l_u$ ($\epsilon_{vu}$ are the dielectric permittivity tensor components). The $\Gamma_{ij}$ are the elastic stiffnesses and the $\Xi_i \Xi_j / \epsilon^s$ are the piezoelectric stiffening contribution to $\Gamma_{ij}$. Equation (1) is written in the coordinate system defined by the crystallographic axes.

The analysis is simplified in a coordinate system in which $\Gamma_{ij}$ is diagonal. The matrix S defining this frame obtains more $(\Gamma_{ij} - \lambda\delta_{ij})S_j = 0$. $\Gamma_{ij}$ is transformed by the well-known rule $S\Gamma S^{-1}$ to $\lambda I$, the diagonal matrix $\lambda_i \delta_{ij}$; $\Xi_i \Xi_j / \epsilon^s$ by $S\Xi\Xi^{-1}S^{-1}/\epsilon^s$ $$((\lambda_i - \overline{\lambda})\,\delta_{ij} + Y_i Y_j)\,U_j = 0. \quad (2)$$

(No summation over i in $\lambda_i \delta_{ij}$.) When the stiffening contribution is small, perturbation type solutions for $\overline{\lambda}$ result:

$$\overline{\lambda}_i = \lambda_i + \Delta_i \text{ where} \quad (3)$$

$$\Delta_i = Y_i^2. \quad (4)$$

With this brief introduction, the $U_j$ may now be evaluated. Before doing so, note that the real symmetric nature of the coefficients of $U_j$ in Eq. (2) requires that the $\vec{U}_i$ be mutually orthogonal. consequently, the $\vec{U}_i$, which are taken as being normalized, may either be rigidly rotated or remain unchanged with respect to the (unstiffened) basis. Also, the correspondence of the $i^{th}$ stiffened axis with the $i^{th}$ unstiffened axis is insured by Eq. (3), which expresses the correspondence between $\lambda_i$ and $\overline{\lambda}_i$, and the validity of Eqs. (3) and (4) is based upon $Y_i^2/\lambda_i << 1$. These remarks suggest that the rotation be an infinitesimal one. Accordingly, the $\vec{U}_i$ are expected to be of the form ($\sim$1, $\sim$0, $\sim$0) and expressions of this type are sought. (The symbols $\sim$1 and $\sim$0 signify quantities nearly equal to 1 and 0).

The $\vec{U}$ follow from Eq. (2), which is written in expanded form below:

$$(\lambda_1 - \lambda)U_1 + Y_1 Y_2 U_2 + Y_1 Y_3 U_3 = 0, \quad (5a)$$

$$Y_2 Y_1 U_1 + (\lambda_2 - \overline{\lambda})U_2 + Y_2 Y_3 U_3 = 0, \quad (5b)$$

$$Y_3 Y_1 U_1 + Y_3 Y_2 U_2 + (\lambda_3 - \lambda)U_3 = 0. \quad (5c)$$

After eliminating, say, $U_3$ from Eqs. (5a) and (5b), and $U_2$ from Eqs. (5a) and (5c), one obtains $$U_1=AY_1/(\bar{\lambda}-\lambda_1),\ U_2=AY_2/(\bar{\lambda}-\lambda_2),\ U_3=AY_3/(\bar{\lambda}-\lambda_3). \quad (6)$$

Normalizing $\vec{U}$ gives A as:

$$1/A^2=Y_1{}^2/(\bar{\lambda}-\lambda_i)^2+Y_2{}^22/(\bar{\lambda}-\lambda_2)^2+Y_3{}^2/(\bar{\lambda}-\lambda_3)^2. \quad (7)$$

Particularizing $\bar{\lambda}=\bar{\lambda}_1=\lambda_1+Y_2{}^2$, $$A_1=Y_1/\{1+Y_1{}^2Y_2{}^2/(\bar{\lambda}_1-\bar{\lambda}_2)^2+Y_1{}^2Y_3{}^2/(\bar{\lambda}_1-\bar{\lambda}_3)^2\}^{\frac{1}{2}} \quad (8)$$

Within this approximation, differences such as $(\bar{\lambda}_1-\bar{\lambda}_2)$ and $(\bar{\lambda}_1\bar{\lambda}_3)$ become $(\lambda_1-\lambda_2)$ and $(\lambda_1-\lambda_3)$ when $\lambda_1$, $\lambda_2$, and $\lambda_3$ are not nearly equal to each other. Accordingly, Eq. (8) yields $A_1=Y_1$ approximately and symmetry in the indices gives $$A_i=Y_i \quad (9)$$

Substituting $\bar{\lambda}_1$for $\bar{\lambda}$ in Eq. (6) determines $\vec{U}_1$. Terms such as $(\bar{\lambda}_1-\bar{\lambda}_2)$ and $(\bar{\lambda}_1-\bar{\lambda}_3)$ occur and are again replaced by $(\lambda_1-\lambda_2)$ and $(\lambda_1-\lambda_3)$. Finally, $\vec{U}_1=(\sim 1, Y_1Y_2/(\lambda_1-\lambda_2), Y_1Y_3(\lambda_1-\lambda_3))$. (10)

$\vec{U}_2$ and $\vec{U}_3$ are similarly found and one obtains $$\begin{bmatrix}\vec{U}_1\\ \vec{U}_2\\ \vec{U}_3\end{bmatrix}=\begin{bmatrix}\sim 1 & Y_1Y_2/(\lambda_1-\lambda_2) & Y_1Y_3/(\lambda_1-\lambda_3)\\ Y_2Y_1/(\lambda_2-\lambda_1) & \sim 1 & Y_2Y_3/(\lambda_2-\lambda_3)\\ Y_3Y_1/(\lambda_3-\lambda_1) & Y_3Y_2/(\lambda_3-\lambda_2) & \sim 1\end{bmatrix} \quad (11)$$

The array is in the form of an infinitesimal rotation matrix; the rotation "vector" is $$d\vec{\Omega}=(Y_2Y_3/(\lambda_2-\lambda_3),\ Y_3Y_1/(\lambda_3-\lambda_1),\ Y_1Y_2/(\lambda_1-\lambda_2)) \quad (12)$$

Any simple relation of the rotation axis to some vector or other property of a crystal is not obvious. Its scalar product with the stiffening vector $\vec{Y}$ is $$d\vec{\Omega}\cdot\vec{Y}=Y_1Y_2Y_3(1/(\lambda_1-\lambda_2)+1/(\lambda_2-\lambda_3)+1/(\lambda_3-\lambda_1)), \quad (13)$$

which in general is neither 0° nor 90°. When one of the $Y_i=0$, the derivation breaks down because multiplication by 0 would then have been performed in arriving at Eq. (6). In this case, for example, $Y_3$ should be set equal to zero in Eqs. (5a), (5b), and (5c) before beginning the elimination process. The result, however, is compatible with Eqs. (12) and (13). The rotation is about the (0,0,1) axis, leaving $\vec{U}_3=(0,0,1)$; $\bar{\lambda}_3=\lambda_3$ and to higher order approximation $\bar{\lambda}_+=\bar{\lambda}_1-Y_1{}^2Y_2{}^2/(\lambda_1-\lambda_2)$ and $\bar{\lambda}_-=\bar{\lambda}_2+Y_1{}^2Y_2{}^2/(\lambda_1-\lambda_2)$.

So far the information obtained pertains to an initial state and a final state, states which are close to each other and connected by $\vec{Y}$. We consider next $\vec{Y}$ to be a continuously variable parameter, choose a particular way in which to vary it, and explore what happens in between the initial and final states. $\vec{Y}$ is to be varied in such a way that it remains parallel to itself while its magnitude increases or scales from 0 (the initial state to $|\vec{Y}|$ (the final state); $\vec{Y}=f\vec{Y}$, where $0\leq f\leq 1$.

Within the small coupling approximation, Eq. (12) applies, $d\vec{\Omega}$ is homogeneous in products of $Y_i$ to second degree. Its magnitude varies as $f^2$ and its direction is unchanged, provided $\lambda_1$, $\lambda_2$, and $\lambda_3$ are assumed to remain constant as f varies. This assumption is valid as this is precisely the meaning of the small coupling approximation: Eqs. (3) and (4) apply and Eq. (4) becomes $\Delta_i=f^2Y_i{}^2$. Consequently, as f is increased continuously to 1, the unstiffened vectors may be considered to be continuously and rigidly rotated about a unique axis to their final position. Each vector prescribes a cone about $d\vec{\Omega}$.

SUMMARY OF THE INVENTION

The ability to vary the stiffening of a crystal in the way specified suggests the ability to steer an ultrasonic acoustic energy beam. As discussed in greater detail below, in the instant invention a transducer, initially set up with its polarization direction in the nearly plane, conical surface determined by two rotated positions of a given characteristic vector, will continue to excite the associated mode. Because stiffening effects the beam direction, the control that makes varying the stiffening possible will be particularly effective and useful in anisotropic materials where, for certain directions and materials, large changes are expected. The choice of particular directions for maximum steering depends upon the detailed examination of the wave surfaces for stiffened and unstiffened elastic waves.

The invention and its mode of operation will be more fully understood from the following detailed description, when taken with the appended drawings in which:

DESCRIPTION OF THE DRAWINGS

FIGS. 1 and 2 are respectively the front and cross-sectional views of a first illustrative acoustic beam deflection device according to the invention;

FIG. 5 is a schematic drawing which illustrates the manner in which a wave-launching transducer is affixed to either the device shown in FIGS. 1, 2 or FIGS. 3, 4.

DETAILED DESCRIPTION OF THE INVENTION

Figure 4:
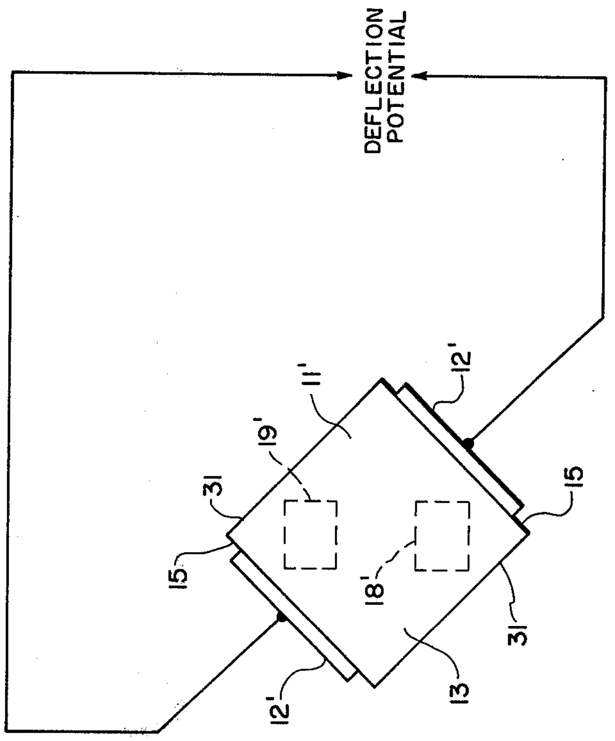
FIGS. 3 and 4 are respectively the front and end views of a second illustrative embodiment of the invention.

As shown in FIGS. 1 and 2, piezoelectric, beam-steering device 10 comprises a block of single-crystal material 11, illustratively alpha-quartz, having a pair of control electrodes 12—12 affixed to the end faces 13—13 thereof. A pair of leads 14—14 connect electrodes 12—12 to some suitable source of deflecting potential. A driving transducer 16, connected to some suitable source of energizing potential 17, is fastened to the electrode 12 at one end of the device. Rays 18 may represent the normal position of the acoustic beam launched by transducer 16; rays 19 would then represent the steered position of the beam, i.e., after application of a potential of appropriate polarity and magnitude to electrodes 12—12. The roles of 18 and 19 are arbitrary. Waves 21 represent the wavefronts in the acoustic beam parallel to faces 13—13.

The normals to end-faces 13—13 are chosen, and the specimen cut from a large bulk crystal, so that the normals are in the desired crystallographic direction. This crystallographic direction is the one to which the acoustic beam wavefronts are perpendicular and a particular direction is selected on the basis of suitable properties. In the instant application, this direction is that in which the acoustic beam is amenable to large changes in direction upon application of deflection signals to electrodes 12—12. Other suitable properties are not limited to the generation of more than one deflecting acoustic beam.

Some particular crystallographic directions and the associated change in the beam direction are listed in Table I below:

TABLE I

Partial Listing of Crystallographic Directions where Beam Steering Exceeds 0.9°

| φ Wave φ | θ Normal θ | Angles Mode | Δ Acoustic Beam Change | φ Unstiff Beam Direction | θ | δ Unstiff Beam Normal Devia | φ Stiff Beam Direction | θ | δ Stiff Beam Normal Devia |
|---|---|---|---|---|---|---|---|---|---|
| 29.8, | 66 | b | 14.12 | 26.51 | 61.81 | 5.1 | 30.72 | 48.10 | 17.9 |
| | | c | 13.24 | 33.64 | 81.31 | 15.7 | 30.12 | 94.08 | 28.1 |
| 24, | 65.5 | b | 3.53 | 28.49 | 91.67 | 26.5 | 30.26 | 88.62 | 23.9 |
| | | c | 3.73 | 49.07 | 52.03 | 25.2 | 47.21 | 55.44 | 22.5 |
| 12, | 60.5 | b | 1.19 | 32.31 | 61.15 | 17.7 | 33.17 | 60.23 | 18.4 |
| | | c | 1.14 | 38.37 | 71.63 | 26.5 | 37.85 | 72.65 | 26.8 |
| −18, | 59 | c | 0.91 | | | | | | |
| −24, | 61.5 | c | 1.04 | | | | | | |
| 29.8, | 66.5 | b | 0.92 | | | | | | |
| (line 1) | | c | 1.49 | | | | | | |
| 27, | 66 | b | 16.11 | 28.17 | 87.99 | 22.0 | 32.48 | 72.44 | |
| | | c | 17.06 | 42.80 | 53.35 | 17.4 | 37.44 | 71.72 | |
| 24, | 65 | b | 15.96 | 33.14 | 81.62 | 18.8 | 40.92 | 67.52 | 15.7 |
| (line 4) | | c | 16.22 | 42.44 | 61.35 | 16.8 | 34.90 | 75.99 | 15.0 |
| | | b' | 6.32 | | | | | | |
| | | c' | 5.89 | | | | | | |
| 18, | 63 | b | 7.80 | 24.63 | 92.53 | 30.2 | 26.37 | 84.92 | 56.78 |
| | | c | 7.96 | 55.32 | 49.09 | 33.6 | 51.85 | 56.55 | 42.31 |
| 12, | 61 | b | 2.25 | | | | | | |
| | | c | 2.12 | | | | | | |
| 29.5, | 66 | | ~21.0 | | | | | | |

| φ Wave φ | θ Normal θ | Angles Mode | Δ Vibrat. Vector Change | θ Unstiff Vibra Direction | φ | δ Unstiff Vibra Normal Devia. | φ Stiff Vibra Direction | θ | δ Stiff Vibra Normal Devia | φ Electric Displacement | θ |
|---|---|---|---|---|---|---|---|---|---|---|---|
| 29.8, | 66 | b | 31.00 | 96.27 | 113.56 | 84.80 | 118.17 | 90.97 | 88.91 | | |
| | | c | 31.00 | −14.54 | 129.17 | 75.54 | 27.08 | 138.35 | 72.39 | | |
| 24, | 65.5 | b | 6.69 | 56.77 | 126.00 | 67.96 | 62.99 | 121.75 | 67.47 | | |
| | | c | 6.70 | −56.36 | 118.39 | 86.38 | −50.80 | 123.10 | 88.47 | | |
| 12, | 60.5 | b | 1.28 | 149.45 | 41.65 | 86.67 | 147.53 | 41.64 | 87.44 | | |
| | | c | 1.25 | 68.15 | 97.66 | 65.49 | 67.28 | 95.57 | 65.37 | | |
| −18, | 59 | c | 0.8 | | | | | | | | |
| −24, | 61.5 | c | 0.7 | | | | | | | | |
| 29.8, | 66.5 | b | 5.7 | | | | | | | | |
| (line 1) | | c | 5.7 | | | | | | | | |
| 27, | 66 | b | 21.39 | 64.59 | 127.49 | 70.92 | 83.70 | 113.71 | 72.80 | | |
| | | c | 21.39 | −47.72 | 116.32 | 87.97 | −27.62 | 129.63 | 81.49 | | |
| 24, | 65 | b | 17.40 | 71.19 | 114.88 | 67.60 | 83.86 | 102.26 | 69.21 | | |
| (line 4) | | c | 17.40 | −40.17 | 128.15 | 87.16 | −19.13 | 135.97 | 81.03 | | |
| | | b' | 107.39 | | | | | | | | |
| | | c' | 72.61 | | | | | | | | |
| 18, | 63 | b | 17.37 | 28.41 | 132.71 | 70.37 | 4.88 | 138.49 | 76.40 | | |
| | | c | 17.38 | −80.42 | 109.28 | 74.15 | −92.73 | 96.68 | 68.53 | | |
| 12, | 61 | b | | | | | | | | | |
| | | c | | | | | | | | | |
| 29.5, | 66 | | | | | | | | | | |

Of course, it is also possible to place the control electrodes on the side faces of the crystal as well as on the end faces, or indeed on both the side and end faces. It is also possible to employ other crystallographic orientations. Table II, below, gives the corresponding orientations and changes in beam direction for some other possible orientations.

TABLE II

SUPPLEMENTARY LIST
CRYSTALLOGRAPHIC DIRECTIONS WITH SIGNIFICANT BEAM CHANGE PROPERTY, PARTIAL LISTING
Angles are in Degrees

| Cryst. Dir. φ | θ | Steer, Ang. Δ | Cryst. Dir. φ | θ | Steer, Ang. Δ | Cryst. Dir. φ | θ | Steer, Ang. Δ |
|---|---|---|---|---|---|---|---|---|
| | | | 24, | 65 | 6 | | | |
| 29.8, | 66 | 14 | 18, | 63 | 8 | 24, | 65.5 | 3 |
| 27, | 66 | 16 | 16, | 22 | 8 | 12, | 60.5 | 1 |
| 18.5, | 63 | 16 | 20, | 63.5 | 9 | 12, | 61 | 2 |
| 22, | 64 | 11 | 26, | 66 | 7 | −12, | 68 | 1 |
| 28.5, | 66 | 10 | 29.9, | 66 | 7 | −18, | 68 | 1.4 |
| 29, | 66 | 17 | 19.63, | 63.43 | 5 | −17, | 68 | 1.4 |
| 29.5, | 66 | 21 | 18.65, | 62.92 | 7 | −16, | 68 | 1.3 |

TABLE II-continued

SUPPLEMENTARY LIST
CRYSTALLOGRAPHIC DIRECTIONS WITH SIGNIFICANT BEAM CHANGE PROPERTY, PARTIAL LISTING
Angles are in Degrees

| Cryst. Dir. φ | θ | Steer, Ang. Δ | Cryst. Dir. φ | θ | Steer, Ang. Δ | Cryst. Dir. φ | θ | Steer, Ang. Δ |
|---|---|---|---|---|---|---|---|---|
| | | | | | | −15, | 68 | 1.2 |
| 19.2, | 63.31 | 16 | | | | −14, | 68 | 1.1 |
| 19.13, | 63.31 | 32* | | | | −13, | 68 | 1.0 |
| | or* | 18 | | | | −12, | 68 | 0.9 |
| 25, | 65.02 | 12 | | | | | | |
| RT CUT | | | | | | −16.5, | 72 | 1.4 |
| | | | | | | −12, | 78.5 | 1.0 |
| 18.65, | 62.925 | 22 | | | | 19.5, | 63 | 1.7 |
| | or | 27 | | | | 19.0, | 63 | 4.7 |

Figure 3:
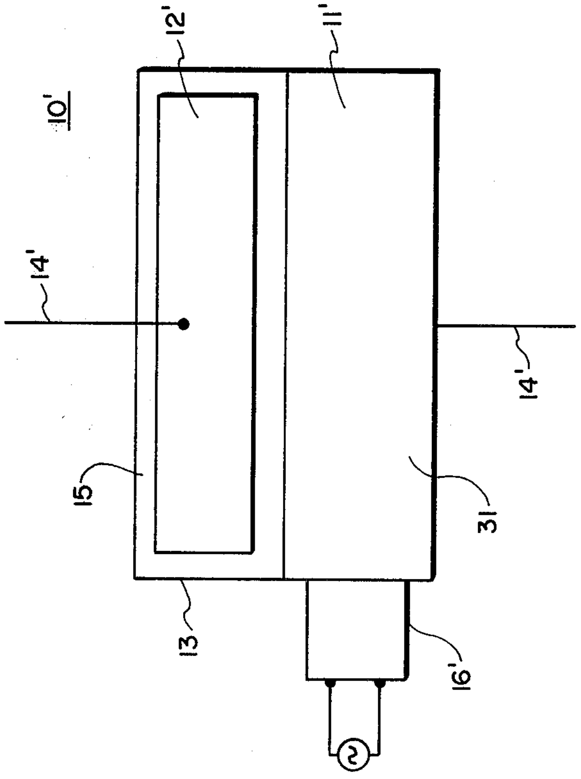

FIGS. 3 and 4 depict the configuration of a device when the control electrodes are positioned on the lateral faces of the crystal rather than on the end faces. As shown, device 10' comprises a block of single-crystal quartz 11' having a pair of control electrodes 12'—12' affixed to the lateral faces 15—15 thereof. A pair of leads 14'—14' connect electrodes 12' to a suitable source of deflecting potential. A driving transducer 16', connected to some suitable source of energizing potential 17', is fastened to one end of the device. In FIG. 4, region 18' may represent the undeflected acoustic beam and region 19' would accordingly represent the deflected beam. In this second embodiment of the invention, the lateral faces 15—15 are cut perpendicular to the electric displacement vector, while the other pair of lateral faces 31—31 are cut parallel to the electric displacement vector. Although not shown in the drawing, a second pair of control electrodes may be affixed to faces 31—31, if desired.

FIG. 5 is an end view of a quartz specimen with the directions of the unstiffened and stiffened vibration eigenvectors indicated at the corner edge, drawn from the origin 0 (inside the specimen). The direction P' in the end face may be the direction which, when the direction P of the transducer is properly aligned, yields equal amplitude vibrations along the V and $\overline{V}$ directions.

The operation of the devices shown in FIGS. 1-2 and 3-4 is based upon the following principles:

1. Significant differences exist in the ultrasonic wave propagation properties for a normal piezoelectric material state and the derived, ideally non-piezoelectric (solely elastic material) state for propagation in a common crystallographic direction;

2. The direction of the acoustic beam can be altered by the controlled alteration of the effective crystal properties between the normal (i.e., piezoelectrically stiffened) and the derived (unstiffened) states;

3. Establishing the specimen boundary faces so that a pair of lateral faces are, say, perpendicular to the induced dielectric displacement and/or establishing a pair of end faces perpendicular to the induced electric field;

4. Providing a specimen which is sufficiently wide to allow the stiffened (undeflected) and unstiffened (deflected) ultrasonic beams to reach the opposite end face without hitting the lateral faces;

5. Providing lateral and end faces of sufficient extent so that the electrodes which are affixed thereto can exert their influence over the entire traverse of the ultrasonic beam; and by 6. Initially placing the polarization or vibration eigenvector P on FIG. 5 of the driving transducer to obtain equal amplitude vibration in the directions of the stiffened and unstiffened eigenvectors for equal excitation of the stiffened and unstiffened modes. (Applications are possible where unequal excitation is desirable.)

The devices operate as follows. Once a crystallographic direction has been chosen, a specimen is cut with its end faces perpendicular to said direction. The beam directions are calculated for the unstiffened and stiffened states, as well as the vibration eigenvectors, et cetera. For end face control, the orientation of the side faces is not necessarily significant; for side face control, the side faces are established and cut perpendicular to the displacement vector, and electrode films and leads are deposited on the appropriate faces. A driving transducer is cemented to one of the end faces and its vibration direction is appropriately placed to yield, in this application, equal excitation amplitude vibrations in the directions of the stiffened and unstiffened vibration vectors when the transducer is excited and when the applied voltages at the controlling electrodes act to change the crystal stiffened propagation properties to those of the unstiffened ideal. In the process of changing the direction $\overline{V}$, the stiffened vibration vector, changes and becomes V, the direction of the unstiffened vibration vector and, also the beam changes from one position to another. The changes can be in two or more discreet steps or gradual. These changes are brought about by the effective change in the crystal properties which result when different electrical conditions are imposed at the controlling electrodes at the boundaries. The selection of the control electrodes perpendicular to the induced electric field and the induced dielectric displacement is designed to align the affixed fields along the induced fields for their optimum reduction and ultimate cancellation, thus achieving the condition of zero induced fields of the unstiffened state.

Figure 6:
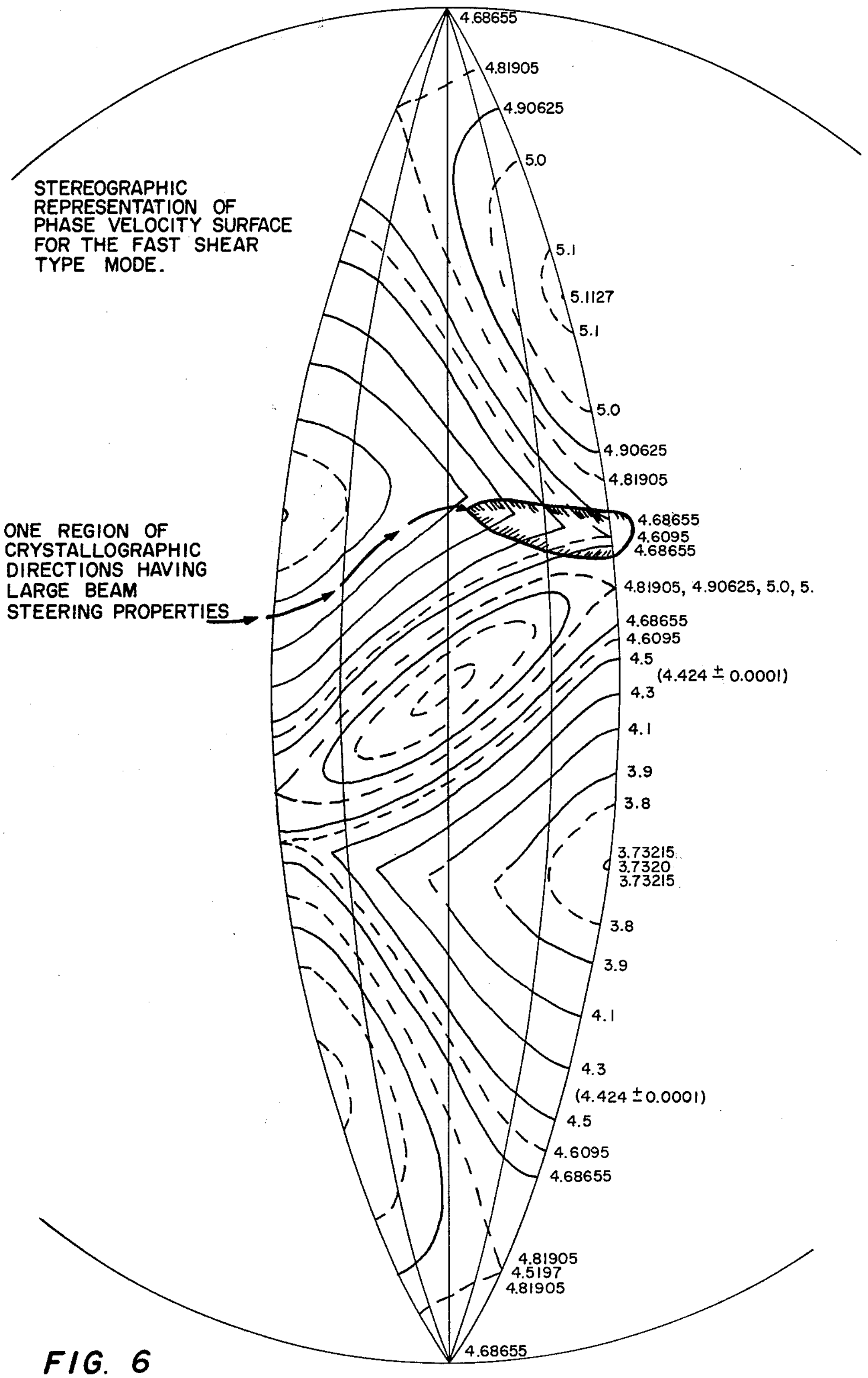
FIGS. 6 and 7 are respectively stereographic representations of phase velocity surfaces for the fast and slow shear type propagation modes in unstiffened quartz.
Figure 7:
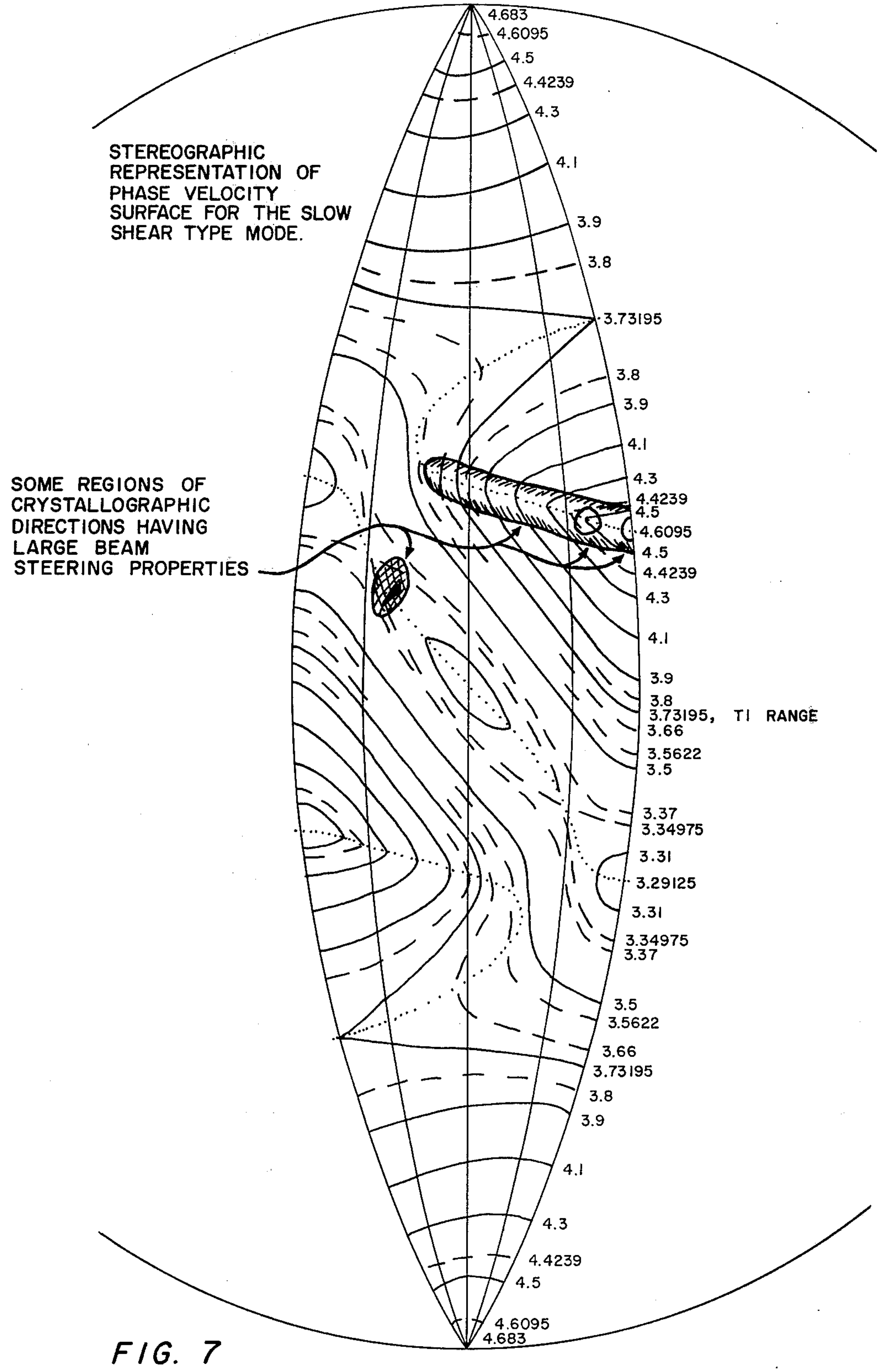

The determination of which crystallographic directions are to be used may be based on a random search or on a systematic analysis and study of the phase-velocity surfaces for electro-elastic mode propagation. A partial analysis shows that directions having maximum deviation of the beam occur in regions. One such region is roughly indicated in FIGS. 6 and 7, which are stereographic representations of the unstiffened phase velocity surfaces in alpha quartz, for the fast and slow shear-type modes. Previously discussed Table I is a partial listing of the crystallographic directions giving steering angles from 0.9 to 17 degrees. So far the maximum beam deviation calculated is 21° for the directions, in spherical coordinates, $\phi=29.5°$, $\theta=66°$.

One skilled in the art can make various changes and substitutions without departing from the spirit and scope of the claimed invention.

What is claimed is:

1. In combination, a block of electroelastically anisotropic single crystal material having at least one pair of juxtaposed plane parallel boundary faces,
   means for launching an ultrasonic acoustic beam in said crystal block which induces a piezoelectric field and induces a dielectric displacement field perpendicular to said induced piezoelectric field as said acoustic beam progresses along said block,
   first and second pair of deflection control electrode means disposed at said at least one pair of boundary faces of said block, and
   means for applying a potential to said at least one pair of said electrode means for creating an applied electric field interacting with said induced fields to alter the direction of propagation of said launched acoustic beam.

2. The combination of claim 1 wherein said boundary faces are end faces of said block and the direction of said applied electric field is parallel to said induced piezoelectric field.

3. The combination of claim 1, wherein said boundary faces are one pair of juxtaposed lateral faces of said block, and said applied electric field is parallel to said dielectric displacement field.

4. The combination of claim 1 wherein said boundary faces are the other pair of juxtaposed lateral faces of said block and said external electric field is perpendicular to said dielectric displacement field.

5. The combination of claim 3 further including electrode means on the other pair of juxtaposed lateral faces of said block and said external electric field is perpendicular to said dielectric displacement field.

6. The combination of claim 2 further including electrode means on at least one of said pairs of juxtaposed lateral end faces of said block.

* * * * *